(12) United States Patent
Ali

(10) Patent No.: US 9,238,870 B2
(45) Date of Patent: Jan. 19, 2016

(54) PLASMA ETCH FOR CHROMIUM ALLOYS

(75) Inventor: Abbas Ali, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 524 days.

(21) Appl. No.: 12/577,335

(22) Filed: Oct. 12, 2009

(65) Prior Publication Data
US 2011/0086488 A1 Apr. 14, 2011

(51) Int. Cl.
C23F 4/00 (2006.01)
G03F 1/80 (2012.01)
H01L 21/3213 (2006.01)
H01L 49/02 (2006.01)

(52) U.S. Cl.
CPC ... *C23F 4/00* (2013.01); *G03F 1/80* (2013.01); *H01L 21/32136* (2013.01); *H01L 21/32137* (2013.01); *H01L 28/24* (2013.01)

(58) Field of Classification Search
USPC .......... 438/8, 385, 384, 382, 381; 430/5, 318; 372/103; 349/43; 347/63; 338/307; 257/529, 363; 216/79, 48
See application file for complete search history.

(56) References Cited

U.S. PATENT DOCUMENTS

| 4,445,966 A * | 5/1984 | Carlson et al. ............. 438/714 |
| 6,365,480 B1 * | 4/2002 | Huppert et al. ............. 438/381 |
| 2003/0003374 A1 * | 1/2003 | Buie et al. ................ 430/5 |
| 2006/0166107 A1 * | 7/2006 | Chen et al. ................ 430/5 |

OTHER PUBLICATIONS

Plummer et al. Silicon VLSI Technology, 2000, Prentice Hall, Inc., pp. 638-639.*

* cited by examiner

*Primary Examiner* — Duy Deo
*Assistant Examiner* — Erin Bergner
(74) *Attorney, Agent, or Firm* — Jacqueline J. Garner; Frank D. Cimino

(57) ABSTRACT

A reactive ion etching (RIE) process comprising a chlorine source gas and an oxygen source gas with an atomic ratio of chlorine to oxygen in the plasma of at least 6 to 1 is used to etch chromium alloy films such as SiCr, SiCrC, SiCrO, SiCrCO, SiCrCN, SiCrON, SiCrCON, CrO, CrN, CrON, and NiCr for example. Additionally, a fluorine source may be added to the etch chemistry.

6 Claims, 1 Drawing Sheet

PLASMA ETCH FOR CHROMIUM ALLOYS

FIELD OF THE INVENTION

This invention relates to the field of plasma etching. More particularly, this invention relates to the plasma etching of chromium and chromium alloys.

BACKGROUND OF THE INVENTION

Chromium and chromium alloy thin films are useful in semiconductor manufacturing processes. For example, chromium alloy thin film resistors are used in integrated circuits and chromium and chromium alloy thin films are used in the fabrication of photo masks.

Chromium alloys are difficult to dry etch. Wet etches for chromium are used when dimension control is not critical. When dimension control is critical, plasma etches such as reactive ion etching (RIE) are used. Typically these etches utilize significant ion bombardment to physically sputter away much of the film. Chromium alloy RIE etches are typically slow and typically deposit residue on the walls of the etching chamber walls that may require frequent cleaning. Linewidth control on critical geometries may also be difficult with physically sputtered thin films

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A reactive ion etching (RIE) process comprising a chlorine source gas and an oxygen source gas with an atomic ratio of chlorine to oxygen in the plasma of at least 6 to 1 is used to etch chromium alloy films such as CrO, CrN, CrON, and NiCr for example. A RIE process containing chlorine, oxygen, and fluorine with an atomic ratio of chlorine to oxygen in the plasma of at least 6 to 1 is used to etch chromium alloy films such as SiCr, SiCrC, SiCrO, SiCrN, and SiCrON for example.

DETAILED DESCRIPTION

Figure 2A:
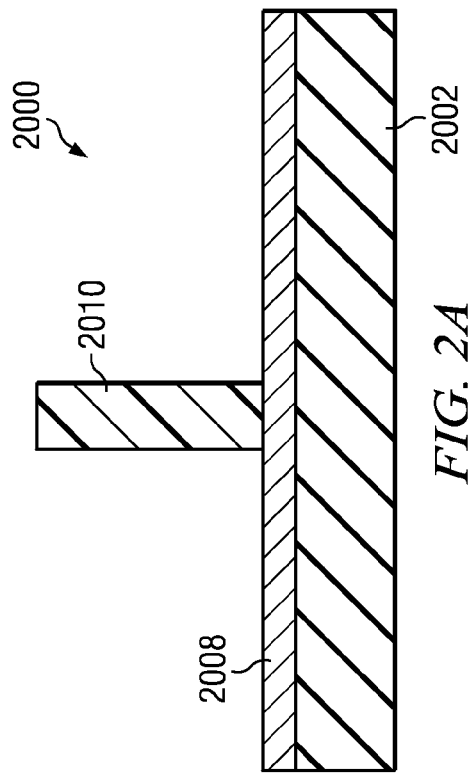
FIGS. 2A and 2B are crossectional views of process steps used to form a resistor according to an example embodiment

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A prior art plasma etch with $Cl_2$, $BCl_3$, $O_2$, and Ar takes 35 seconds to etch a 3.4 nm thick SiCrC resistor film (Etch rate of 0.1 nm/sec). The prior art plasma etch has a large sputtering component which forms residues which deposit on the walls of the chamber requiring frequent chamber cleans.

The plasma etch which uses $Cl_2$, $O_2$, and optionally $CF_4$ described below according to the preferred embodiment can be used to etch a 34 nm thick SiCrC film in 60 seconds with a vertical sidewall profile and without deposition of residue on the walls of the chamber (Etch rate of 0.55 nm/sec).

Herein, the chromium-based thin film or the thin film made of the material containing chromium also includes a thin film containing chromium and another element or elements. For example, the thin film may be chromium alloys such as SiCr, SiCrC, SiCrO, SiCrCO, SiCrCN, SiCrON, SiCrCON, and so on. The thin film may have any layer structure such as a single-layer film having uniform composition, a plurality of layers different in composition in a film thickness direction, a composition-gradient layer varied in composition in a film thickness direction, and so on. The thin film thickness may be in the range of 1 nm to 100 nm depending upon the desired resistance and intended application. In one embodiment a 3.2 nm SiCrC film has a resistance of about 1000 ohms per square and in another embodiment a 32 nm SiCrC film has a resistance of about 100 ohms per square.

The plasma etch of the instant embodiment uses an etch chemistry comprising a chlorine source and an oxygen source resulting in a chlorine to oxygen atomic ratio of 6 or more. For example, the plasma etch conditions listed in Table 1 may be used. Preferred embodiment conditions are also given in Table 1. The primary chromium etchant gases are chlorine and oxygen. In prior art the chlorine to oxygen atomic ratio is typically 4 or less. While some gaseous chromium alloy etch products are formed with this Cl:O ratio, much of the chromium alloy is removed by sputtering which forms residue that may deposit on the walls of the etch chamber and require frequent chamber cleans. A chlorine to oxygen atomic ratio of 6 or more yielded the unexpected result that chromium alloys may be chemically etched producing gaseous chromium etch products $CrO_xCl_y$ including $Cr_2O_2$ and $CrO_2Cl_2$, which may be readily removed from the etching chamber with little to no deposition on the sidewalls. The etching rate of the chromium alloy film may be significantly enhanced when compared to the prior art RIE etch chemistry and the linewidth control of critical features may be improved.

When the chromium alloy includes silicon, such as SiCr, SiCrC, SiCrO, SiCrCO, SiCrCN, SiCrON, SiCrCON, a fluorine source such as $CF_4$ is preferably added to the etch chemistry.

In addition to the $Cl_2$, $O_2$, and optional $CF_4$ other gases may be present in the chamber without departing from the instant invention For example, other gases may be added to the etch depending upon the chromium alloy being etched. Other chlorine containing gases such as SiCl4 for example, other oxygen containing gases such as $CO_2$ for example and other fluorine containing gases such as $CHF_3$ for example may be used as long as the atomic ratio of Cl to O in the plasma is maintained at 6 or greater. He, Ar, or $N_2$ may also be present in the chamber without departing from the instant invention.

Figure 1:
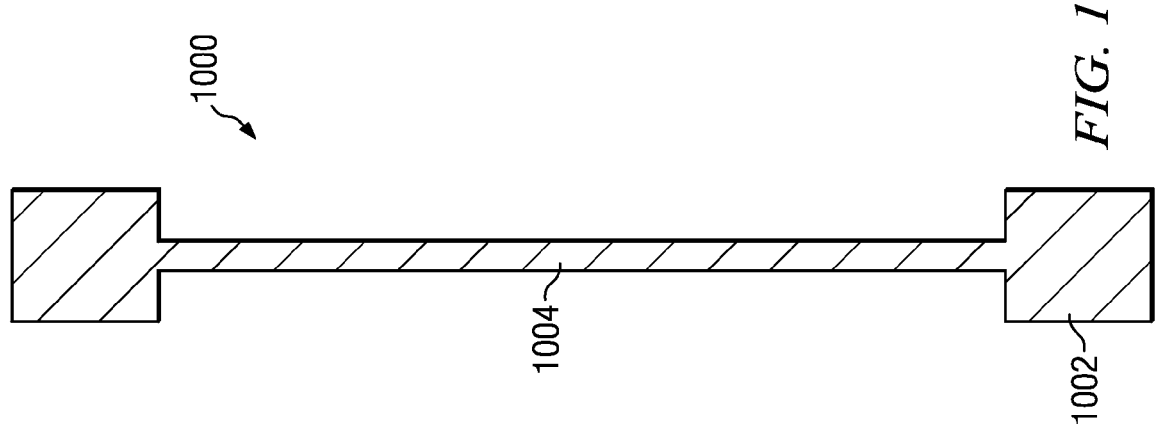
FIG. 1 is a top view of a resistor structure

FIG. 1 is a top view of a chromium alloy resistor 1000 according to an embodiment of the instant invention. Resistor 1000 includes contact landing pads 1002 for providing electrical contact to each end of the resistor and the body 1004 of the resistor 1000. Chromium alloy resistor 1000 preferably comprises SiCrC, but other chromium alloys such as SiCr or SiCrO or SiCrN may also be used.

FIG. 2A shows a dielectric 2002 upon which a thin film chromium alloy 2008 is deposited. In a preferred embodiment, thin film chromium alloy 2008 comprises SiCrC used in the formation of a thin film resistor on top of a dielectric 2002 which is over an integrated circuit. Other chromium alloys such as SiCr, SiCrO, or SiCrN alternatively may be used. The resistance of the thin film resistor depends upon the thickness and composition of the film. For example a SiCrC alloy film may have a resistance of approximately 1000 ohms per square for a 3.2 nm thick thin film and a resistance of approximately 100 ohms per square for a 32 nm thick film.

Still referring to FIG. 2A, photoresist pattern 2010 is formed on the thin film chromium alloy 2008. In one preferred embodiment, photoresist pattern 2010 is a thin film resistor pattern such as that used to form the resistor 1000 of FIG. 1.

Figure 2B:
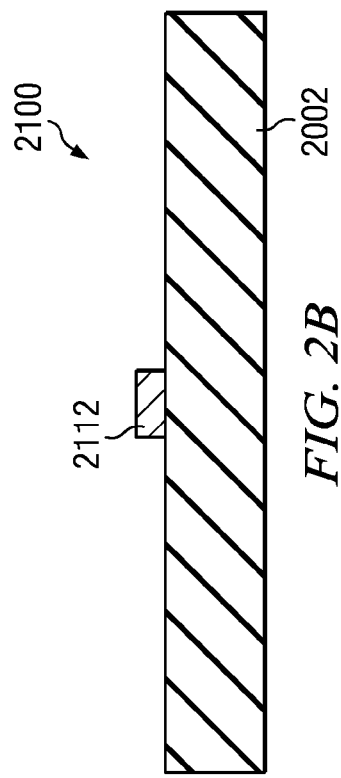

FIG. 2B shows a crossection of the chromium alloy structure 2112 after it is RIE etched with the preferred embodiment conditions described in Table 1. For example, chromium alloy structure 2112 may be a thin film resistor such as that shown in FIG. 1. The photoresist pattern 2010 is removed after the etch. In the example embodiment, a 34 nm SiCrC may be etched in 60 seconds.

TABLE 1

| ITEM | RANGE | PREFERRED EMBODIMENT | UNITS |
| --- | --- | --- | --- |
| Source Power | 500-2000 | 1400 | watts |
| Pressure | 5-200 | 8 | mtorr |
| Temperature | 30-90 | 65 | C. |
| $O_2$ | 1-35 | 12 | sccm |
| $Cl_2$ | 7-250 | 80 | sccm |
| $CF_2$ | 0-100 | 10 | sccm |
| Ar | 0-300 | 0 | sccm |

A thin film resistor is used to illustrate the embodiment, but chromium alloys may be used for other purposes and etched according to this embodiment. For example, chromium and chromium alloys such as CrN, CrNi, CrO, CrNO, CrC, CrCO, CrCON and so on that may be used to form photomasks may be etched with improved linewidth control using the preferred embodiment.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for fabricating an integrated circuit comprising the steps of:
   forming a thin film comprising a silicon-chromium alloy on a dielectric layer located on a substrate of said integrated circuit;
   providing a photoresist pattern on said thin film; and
   exposing said thin film with said photoresist pattern to a reactive ion etching chemistry comprising a chlorine source, an oxygen source, and a fluorine source wherein an atomic ratio of said chlorine to oxygen is at least 6 to form a thin film resistor within said integrated circuit.

2. The method of claim 1 wherein said silicon-chromium alloy is selected from the group consisting of SiCr, SiCrO, SiCrN, SiCrON, SiCrC, SiCrCO, SiCrCN, and SiCrCON.

3. The method of claim 1 wherein said thin film is SiCrC.

4. The method of claim 1 wherein said exposing step utilizes a source power in a range of 500 to 2000 watts, a pressure in a range of 5 to 200 millitorr, a temperature in a range of 30 to 90 degrees Celsius, an oxygen flow of said oxygen source in a range of 1 to 35 sccm, a chlorine flow of said chlorine source in a range of 6 to 250 sccm, and a $CF_4$ flow of the fluorine source in a range of 0 to 100 sccm.

5. The method of claim 4 wherein said source power is 1400 watts, said pressure is 8 millitorr, said temperature is 65 degrees Celsius, said oxygen flow is 12 sccm, said chlorine flow is 80 sccm and said $CF_4$ flow is 10 sccm.

6. A method for fabricating an integrated circuit comprising the steps of:
   forming a layer of SiCrC on a dielectric layer located on a substrate of said integrated circuit;
   providing a photoresist pattern on said layer of SiCrC; and
   exposing said layer of SiCrC with said photoresist pattern to a reactive ion etching chemistry comprising $Cl_2$, $O_2$, and $CF_4$ wherein an atomic ratio of chlorine to oxygen is at least 6 to form a thin film resistor within said integrated circuit.

\* \* \* \* \*